(12) United States Patent
Roy et al.

(10) Patent No.: US 11,177,164 B2
(45) Date of Patent: Nov. 16, 2021

(54) SELF-ALIGNED HIGH ASPECT RATIO STRUCTURES AND METHODS OF MAKING

(71) Applicant: Applied Materials, Inc., Santa Clara, CA (US)

(72) Inventors: Susmit Singha Roy, Sunnyvale, CA (US); Praburam Gopalraja, Santa Clara, CA (US); Abhijit Basu Mallick, Palo Alto, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/638,820

(22) PCT Filed: Aug. 6, 2018

(86) PCT No.: PCT/US2018/045384
§ 371 (c)(1),
(2) Date: Feb. 13, 2020

(87) PCT Pub. No.: WO2019/036214
PCT Pub. Date: Feb. 21, 2019

(65) Prior Publication Data
US 2020/0194304 A1 Jun. 18, 2020

Related U.S. Application Data

(60) Provisional application No. 62/544,891, filed on Aug. 13, 2017.

(51) Int. Cl.
*H01L 21/02* (2006.01)
*H01L 21/768* (2006.01)
(Continued)

(52) U.S. Cl.
CPC .. *H01L 21/76816* (2013.01); *H01L 21/02175* (2013.01); *H01L 21/02244* (2013.01); *H01L 21/28568* (2013.01); *H01L 21/31053* (2013.01); *H01L 21/31111* (2013.01); *H01L 21/3212* (2013.01); *H01L 21/7684* (2013.01); *H01L 21/76834* (2013.01); *H01L 21/76877* (2013.01);
(Continued)

(58) Field of Classification Search
None
See application file for complete search history.

(56) References Cited

U.S. PATENT DOCUMENTS 8,575,753 B2 11/2013 Choi et al.
10,083,834 B2 9/2018 Thompson et al.
(Continued)

FOREIGN PATENT DOCUMENTS

KR 20130046664 A 5/2013

OTHER PUBLICATIONS

PCT International Search Report and Written Opinion in PCT/US2018/045384 dated Nov. 28, 2018, 10 pages.

*Primary Examiner* — Bradley Smith
(74) *Attorney, Agent, or Firm* — Servilla Whitney LLC (57) ABSTRACT

Processing methods to form self-aligned high aspect ratio features are described. The methods comprise depositing a metal film on a structured substrate, volumetrically expanding the metal film, depositing a second film between the expanded pillars and optionally recessing the pillars and repeating the process to form the high aspect ratio features.

8 Claims, 4 Drawing Sheets

(51) Int. Cl.
*H01L 21/285* (2006.01)
*H01L 21/3105* (2006.01)
*H01L 21/311* (2006.01)
*H01L 21/321* (2006.01)

(52) U.S. Cl.
CPC .. *H01L 21/76888* (2013.01); *H01L 21/76897* (2013.01)

(56) References Cited

U.S. PATENT DOCUMENTS

| | | |
|---|---|---|
| 10,319,591 B2 | 6/2019 | Duan et al. |
| 2005/0167846 A1 | 8/2005 | Aoyama |
| 2005/0266627 A1* | 12/2005 | Furukawa ............. H01L 51/057 |
| | | 438/197 |
| 2010/0203725 A1 | 8/2010 | Choi et al. |
| 2013/0109148 A1 | 5/2013 | Oh et al. |
| 2016/0049427 A1* | 2/2016 | Zang ................. H01L 21/76829 |
| | | 257/347 |
| 2016/0190238 A1 | 6/2016 | Cheng et al. |
| 2017/0133224 A1 | 5/2017 | Bao et al. |
| 2018/0096847 A1 | 4/2018 | Thompson et al. |
| 2018/0130657 A1 | 5/2018 | Duan et al. |

\* cited by examiner

SELF-ALIGNED HIGH ASPECT RATIO STRUCTURES AND METHODS OF MAKING

CROSS-REFERENCE TO RELATED APPLICATIONS

This application is the National Stage entry of PCT/US2018/045384, filed on Aug. 6, 2018, which claims priority to United States Provisional Application. Ser. No. 62/544,891, filed Aug. 13, 2017, the entire disclosures of which are hereby incorporated by reference herein.

TECHNICAL FIELD

The present disclosure relates generally to methods of forming high aspect ratio structures. In particular, the disclosure relates to methods for forming self-aligned high aspect ratio structures.

BACKGROUND

The semiconductor industry is rapidly developing chips with smaller and smaller transistor dimensions to gain more functionality per unit area. As the dimensions of devices continue to shrink, so does the gap/space between the devices, increasing the difficulty to physically isolate the devices from one another.

Creating high aspect ratio (HAR) structures is one of the challenges in the field of device patterning. Several structures in logic and memory benefit from high aspect ratios. To continue device scaling, fundamental limitations of the current process flow need to be overcome.

Therefore, there is a need in the art for new methods for forming high aspect ratio structures.

SUMMARY

One or more embodiments of the disclosure are directed to methods of forming ultra-high aspect ratio structures. The methods comprise depositing a metal film in the features of a structured substrate. The structured substrate comprises a plurality of features that extend into the substrate a depth from a surface of the substrate. The metal film is volumetrically expanded to form a metal oxide pillar that extends straight out of the feature. A second film is deposited between the pillars so that a top of the second film is about equal with a top of the pillars. A portion of the pillars are removed so that the top of the pillars is below the top of the second film. Depositing the metal film, volumetrically expanding the metal film, depositing the second film and optionally removing a portion of the pillars are repeated to grow a high aspect ratio feature of a predetermined height. The pillars are removed from the features to form the high aspect ratio features.

Additional embodiments of the disclosure are directed to methods of forming ultra-high aspect ratio structures. The methods comprise depositing a metal film in the features of a structured substrate and forming an overburden of the metal film. The structured substrate comprises a plurality of features that extend into the substrate a depth from a surface of the substrate. The metal film comprises tungsten. The overburden of the metal film is removed. The metal film is volumetrically expanded to form a metal oxide pillar that extends straight out of the feature. The metal oxide pillar comprises tungsten oxide. A second film is deposited between the pillars and forming an overburden of the second film. The overburden of the second film is removed so that a top of the second film is about equal with a top of the pillars. A portion of the pillars is optionally removed so that the top of the pillars are below the top of the second film. Depositing the metal film, volumetrically expanding the metal film, depositing the second film and optionally removing a portion of the pillars are repeated to grow a high aspect ratio feature of a predetermined height. The pillars are removed from the features to form the high aspect ratio features.

Further embodiments of the disclosure are directed to methods of forming ultra-high aspect ratio structures. The methods comprise: (a) depositing a tungsten film in the features of a structured substrate, the structured substrate comprising a plurality of features that extend into the substrate a depth from a surface of the substrate, the tungsten film forming a tungsten overburden; (b) removing the tungsten overburden by CMP; (c) volumetrically expanding the tungsten film to form a tungsten oxide pillar that extends straight out of the feature; (d) depositing a second film between the tungsten oxide pillars so that a second film overburden is formed; (e) removing the second film overburden by CMP; (f) optionally removing a portion of the tungsten oxide pillars so that the top of the pillars is below the top of the second film and repeating (a) through (e) to grow a high aspect ratio feature of a predetermined height; and (g) removing all of the pillar from the features.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure are directed to methods of forming self-aligned high aspect ratio structures. Some embodiments of the disclosure advantageously provide methods that utilize volumetric expansion of tungsten to self-align features. For example, tungsten can be deposited on a structure of holes or trenches by ALD followed by oxidation to form $WO_x$ and the volume expansion during oxidation pushes a pillar growing out of the holes or trenches. These pillars are bottom-up pillars, selectively grown from tungsten.

Some embodiments of the disclosure advantageously provide methods to remove the pillars selectively using etch chemistry specific to the pillar material. For example, pillars of $WO_x$ may be selectively removed by etching using $WCl_5$, $WCl_6$, $WOCl_4$, or other etchants. Some embodiments of the disclosure advantageously provide methods that utilize repeated pillar growth and selective removal to form high aspect ratio structures.

In some embodiments, a structured substrate acts as a template for building high aspect ratio structures. A cycle comprising: conformal metal deposition; metal CMP or selective metal recess; pillar formation; flowable gapfill between column structures; dielectric CMP or selective dielectric recess and pillar removal is repeated. After a number of cycles have been repeated to form a high aspect ratio structure, the pillars are removed to leave high aspect ratio features (e.g., trenches or vias).

FIGS. 1A through 1M show an exemplary embodiment of the method. While the method is described with respect to the embodiment illustrated, those skilled in the art will recognize that certain processes or sequences can be moved or omitted and other processes or sequences can be included without deviating from the scope of the disclosure.

Figure 1A:
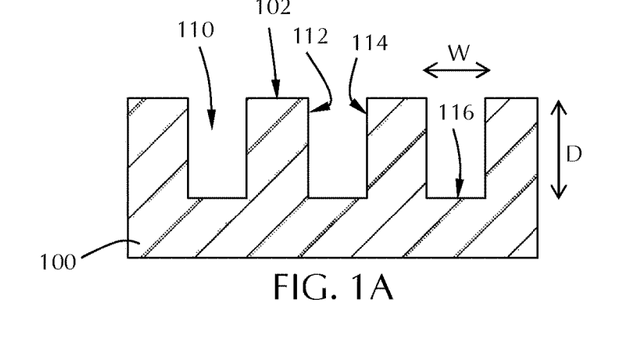
FIGS. 1A through 1M show a schematic representation of a method for forming high aspect ratio structures in accordance with one or more embodiment of the disclosure.

FIG. 1A shows a substrate 100 that acts as a structured template for formation of the high aspect ratio features. The substrate 100 is also referred to as a structured substrate. In the partial cross-sectional view illustrated, the substrate 100 includes at least one feature 110. The Figures show substrates 100 having three features 110 for illustrative purposes; however, those skilled in the art will understand that there can be more or less than three features. The shape of the feature 110 can be any suitable shape including, but not limited to, trenches and vias. The vias can be three dimensional variants of shapes with a cross-section represented by a circle, triangle, square, rectangle, pentagon, hexagon, heptagon, octagon, nonagon, decagon, undecagon, dodecagon or higher order polygon. For example, a three dimensional variant of a circle would be a cylinder, whereas a three dimension variant of an octagon would be an octagonal prism.

As used in this regard, the term "feature" means any intentional surface irregularity. Suitable examples of features include, but are not limited to trenches which have a top, two sidewalls and a bottom, peaks which have a top and two sidewalls extending upward from a surface and vias which have sidewalls extending down from a surface with an open bottom. Features can have any suitable aspect ratio (ratio of the depth of the feature to the width of the feature). In some embodiments, the aspect ratio is greater than or equal to about 0.5:1, 1:1, 2:1, 3:1, 4:1, 5:1, 10:1, 15:1, 20:1, 25:1, 30:1, 35:1 or 40:1.

The substrate 100 has a substrate surface 102 with at least one feature 110 forming an opening in the substrate surface 102. The feature 110 extends from the substrate surface 102 to a depth D to a bottom surface 116. The feature 110 has a first sidewall 112 and a second sidewall 114 that define a width W of the feature 110. The open area formed by the sidewalls 112, 114 and bottom 116 are also referred to as a gap or trench.

The embodiment illustrated shows the features 110 formed in a unitary material. In some embodiments, the features 110 are formed in a binary material in which the sidewalls 112, 114 of the features 110 are a different material than the bottom 116 of the features. For example, the substrate 100 can have an oxide material that forms the bottom of the features 110 and a nitride material that extends from the oxide material to form the sidewalls 112, 114 of the features 110.

The substrate 100, or a binary material substrate, is provided for processing. As used in this regard, the term "provided" means that the substrate is placed into a position or environment for further processing.

Figure 1B:
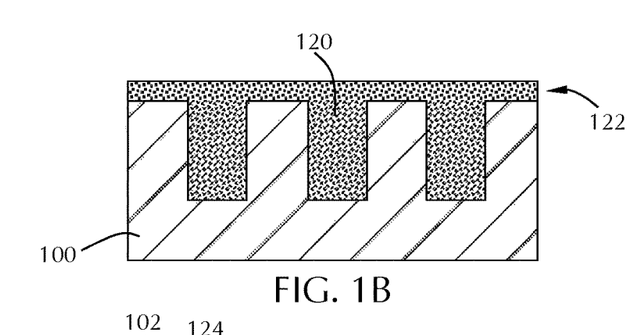

Referring to FIG. 1B, a metal film 120 is formed on the substrate 100 so that the metal film 120 fills the features 110. The metal film 120 can be any suitable film formed by any suitable process including, but not limited to, chemical vapor deposition, plasma-enhanced chemical vapor deposition, atomic layer deposition, plasma-enhanced atomic layer deposition and/or physical vapor deposition. In some embodiments, the metal film 120 is formed by atomic layer deposition or plasma-enhanced atomic layer deposition.

The metal film 120 of some embodiments is a conformal film deposited by atomic layer deposition. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal film deposited by ALD in various embodiments of the disclosure would provide coverage over the deposited region of essentially uniform thickness on complex surfaces.

The metal film 120 can include any suitable metal that can be volumetrically expanded in a straight-up manner. Suitable metal films include, but are not limited to, films including one or more of Co, Mo, W, Ta, Ti, Ru, Rh, Cu, Fe, Mn, V, Nb, Hf, Zr, Y, Al, Sn, Cr and/or La. In some embodiments, the metal film 120 comprises tungsten. In some embodiments, the metal film 120 consists essentially of tungsten. As used in this specification and the appended claims, the term "consists essentially of tungsten" means that the bulk portion of the film—not including the interface region(s)—is greater than or equal to about 95%, 98% or 99% tungsten, on an atomic basis.

In some embodiments, the metal film 120 is formed substantially seamlessly within the feature 110. In some embodiments, a seam may be formed within the width W of the feature 110. The seam can be any gap, space or void that forms between the walls of the feature 110.

Figure 1C:
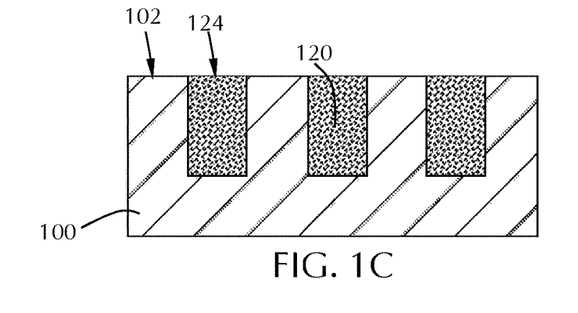

The embodiment illustrated in FIG. 1B includes an overburden 122 formed on the surface 102 of the structured substrate 100. The overburden 122 is the material that forms outside of the features 110. In some embodiments, the overburden 122 is removed so that a top surface 124 of the metal film 120 is substantially coplanar with, or below the surface 102 of the substrate 100, as illustrated in FIG. 1C. As used in this manner, the term "substantially coplanar" means that the plane formed by the metal film 120 is within ±5°, 4°, 3°, 2° or 1° of the plane formed by the surface 102 of the substrate 100. In some embodiments, the top surface 124 is below the surface 102 of the substrate. In some embodiments, the top surface 124 of the metal film 120 is at a height greater than or equal to about 40%, 50%, 60%, 70%, 80% or 90% of the depth D of the feature 110. In some embodiments, the metal 120 is formed so that there is no overburden 122.

Removal of the overburden 122 can be accomplished by any suitable technique known to the skilled artisan. In some embodiments, the overburden 122 can be removed by a chemical-mechanical planarization (CMP) process. For example, a metal CMP process can be used. In some embodiments, the overburden 122 is removed by a selective etching process that removes the metal film 120 without affecting the substrate 100.

Figure 1D:
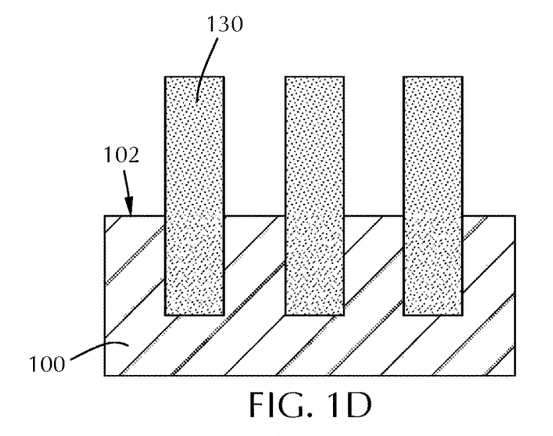

As shown in FIG. 1D, the metal film 120 is then oxidized by exposure to an oxidizing agent or oxidizing conditions to convert the metal film 120 to a metal oxide pillar 130. The conversion of the metal film 120 to the metal oxide pillar 130 is the result of a volumetric expansion process which volumetrically expands the metal film 120. The volumetric expansion of the metal film 120 can be in the range of about 10% to about 1000%, or in the range of about 50% to about 800%, or in the range of about 100% to about 700%. In some embodiments, volumetric expansion of the metal film 120 causes the height of the top surface 132 of the metal oxide pillar 130 to be greater than or equal to about 150%, 200%, 250%, 300% or 350% of the height of the metal film 120 prior to expansion. In some embodiments, metal film 120 is formed in the features 110 with a seam (not shown) and volumetric expansion to form the metal oxide pillars 130 fills the seam.

The oxidizing agent can be any suitable oxidizing agent including, but not limited to, $O_2$, $O_3$, $N_2O$, $H_2O$, $H_2O_2$, CO, $CO_2$, $NH_3$, $N_2/Ar$, $N_2/He$, $N_2/Ar/He$ and combinations thereof. In some embodiments, the oxidizing conditions comprise a thermal oxidation, plasma enhanced oxidation, remote plasma oxidation, microwave and radio-frequency (e.g., ICP, CCP).

Oxidation of the metal film 120 can occur at any suitable temperature depending on, for example, the composition of the film and the oxidizing agent. In some embodiments, the oxidation occurs at a temperature in the range of about 25° C. to about 1100° C. In some embodiments, oxidation occurs at a temperature greater than or equal to about 250° C., 300° C., 350° C., 400° C., 450° C., 500° C. or 550° C.

Suitable metal containing films include derivatives of a metal film. Suitable derivatives of the metal film include, but are not limited to, nitride, boride, carbide, oxynitride, oxyboride, oxycarbide, carbonitride, borocarbide, boronitride, borocarbonitride, borooxynitride, oxycarbonitride, borooxycarbide and borooxynitride. Those skilled in the art will understand that the metal film deposited may have a non-stoichiometric amount of atoms within the metal film. For example, a film designated as WN may have different amounts of tungsten and nitrogen than the 1:1 stoichiometry suggested by the use of "WN". The WN film may be, for example, 90 atomic % tungsten. The use of WN to describe a tungsten nitride film means that the film comprises tungsten and nitrogen atoms and should not be taken as limiting the film to a specific composition. In some embodiments, the film consists essentially of the designated atoms. For example, a film consisting essentially of WN means that the composition of the film is greater than or equal to about 95%, 98% or 99% tungsten and nitrogen atoms.

As shown in FIG. 1D, during expansion, the fidelity of the feature shape is maintained on the top of the feature so that the metal film 120 grows straight up from the feature 110 to form the metal oxide pillar 130. As used in this regard, "straight up" means that the film forms a surface and that the portion of the surface adjacent the feature sidewall 112, 114 is substantially coplanar with the sidewall 112, 114. A surface is coplanar with the sidewall where the angle formed at the junction of the sidewall and the surface is ±10°.

Figure 1E:
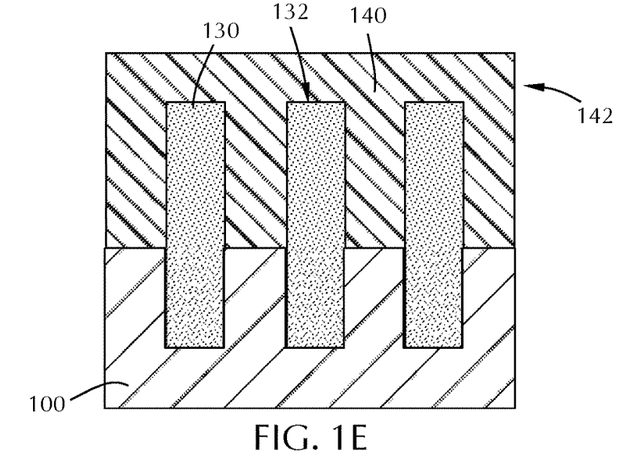

As shown in FIG. 1E, a gapfill process deposits a second film 140 between the pillars 130 on the substrate 100. The surface 102 of the substrate 100 is covered by the second film 140. In some embodiments, the gapfill second film 140 is a flowable film. In some embodiments, the gapfill second film 140 is deposited by one or more of atomic layer deposition or chemical vapor deposition or a plasma-enhanced variety of either. In some embodiments, the gapfill second film 140 is formed substantially seamlessly within the spaces between the pillars 130.

Figure 1F:
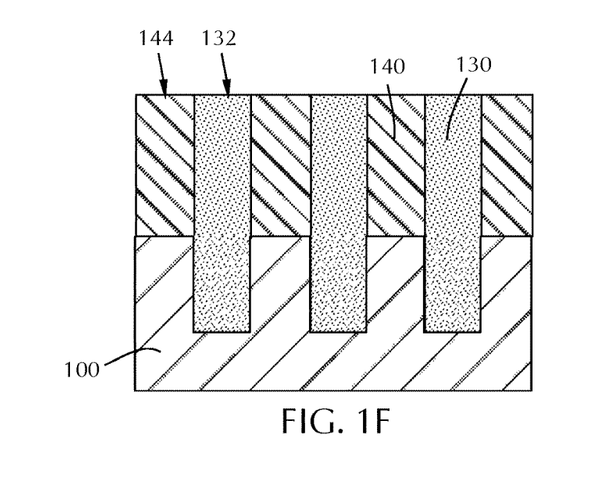

The embodiment illustrated in FIG. 1E includes an overburden 142 formed on the top surface 132 of the pillars 130. In some embodiments, the overburden 142 is removed so that a top surface 144 of the second film 140 is substantially coplanar with, or below the top surface 132 of the pillars 130, as illustrated in FIG. 1F. As used in this manner, the term "substantially coplanar" means that the plane formed by the second film 140 is within ±5°, 4°, 3°, 2° or 1° of the plane formed by the surface 132 of the pillars 130. In some embodiments, the top surface 144 is below the surface 132 of the pillars 130. In some embodiments, the top surface 144 of the second film 140 is below the top surface 132 of the pillars 130 by an amount greater than or equal to about 5%, 10%, 20%, 30%, 40%, 50%, 60% or 70% of the difference in height between the top surface 132 of the pillars 130 and the surface 102 of the substrate 100. In some embodiments, the second film 140 is formed so that there is no overburden 142.

Removal of the overburden 142 can be accomplished by any suitable technique known to the skilled artisan. In some embodiments, the overburden 142 can be removed by a chemical-mechanical planarization (CMP) process. For example, a metal CMP process can be used. In some embodiments, the overburden 142 is removed by a selective etching process that removes the second film 140 without affecting the substrate 100, pillars 130 or any layer under the second film 140.

Figure 1G:
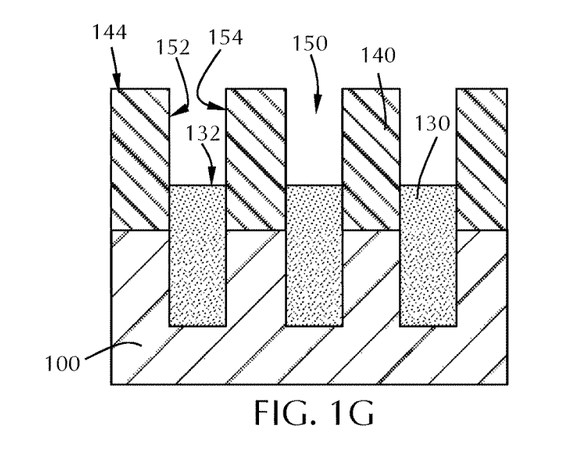

Referring to FIG. 1G, the pillars 130 are recessed to form gaps 150 between the films 140. The top surface 132 of the pillars 130 are recessed an amount greater than or equal to about 10%, 20%, 30%, 40%, 50% or 60% of the height of the second film 140. The gaps 150 expose sidewalls 152, 154 of the second film 140.

As can be seen in FIG. 1G, the sidewalls 152, 154 and the top surface 132 of the recessed pillars 130 resemble the original features 110 illustrated in FIG. 1A. The gaps 150 are used in the same manner as the features 110 to continue to grow a self-aligned high aspect ratio structure by repeating the process illustrated with respect to FIGS. 1B through 1F.

The etching or removal process can be selective for the pillars 130. Etching of the pillars 130 can be done by any suitable technique. In some embodiments, etching the pillars 130 comprises exposing the pillars 130 to a metal halide compound. In some embodiments, the metal halide compound has a different metal than the pillars 130. In some embodiments, the metal halide compound has the same metal as the pillars 130.

In some embodiments, etching the pillars 130 comprises exposure to a metal-and-halogen-containing precursor (e.g. $WCl_6$), also referred to as a metal halide precursor. The metal halide precursor can react with the pillars 130. In some embodiments, exposure to the metal halide precursor causes an exothermic reaction with the pillars 130 and no plasma is present in the substrate processing region. No plasma excites the metal-halide precursor prior to entering the substrate processing region according to one or more embodiments.

In an exemplary non-limiting process, the pillar 130 comprises tungsten and is expanded by reaction with oxygen to form tungsten oxide, which may take the form of $WO_3$. Exposure of $WO_3$ to $WCl_6$ (or possibly $WCl_5$) forms volatile $WOCl_4$ and/or $WO_2Cl_2$ which leaves the surface until all tungsten oxide is removed.

In some embodiments, the metal halide precursor includes two or more or only two different elements including a metal element and a halogen element. The metal halide precursor may include only a single atom of the metal element but multiple atoms of the same halogen element (as is the case for $WCl_6$ and $WCl_5$). The metal element of the metal halide may include one or more of titanium, hafnium, zirconium, vanadium, niobium, tantalum, chromium, molybdenum, tungsten, manganese, rhenium, technetium, iron, aluminum and gallium in embodiments. In some embodiments, the metal element of the metal halide has an atomic number of 22, 23, 24, 40, 41, 42, 72, 73 or 74. In one or more embodiments, the metal element comprises an element of group 4, group 5 or group 6 of the periodic table or may be transition metals. The halogen element may be one of F and Cl according to one or more embodiments. The halogen element may be one or more of F, Cl, Br and/or I in some embodiments. In some embodiments, the metal-and-halogen-containing precursor fluorine-free. Some examples of suitable metal halide precursors include, but are not limited to, vanadium pentahalides, tantalum pentahalides, chromium hexahalides, molybdenum pentahalides, molybdenum hexahalides, niobium pentahalides, tungsten pentahalides, tungsten hexahalides, and manganese tetrahalides. In some embodiments, the metal halide precursors include, but are not limited to, vanadium halides, tantalum halides, chromium halides, molybdenum halides, niobium halides, tungsten halides and/or manganese halides, where the oxidation state of the metal element can be any suitable oxidation state.

The etch processes of some embodiments has a selectivity for the pillar 130 material relative to the second film 140 that is greater than or equal to about 10:1, greater than or equal to about 15:1, greater than or equal to about 20:1 or greater than or equal to about 25:1.

In some embodiments, there is little or no local plasma used in the etch process to make etch processes more selective, delicate and isotropic. The term "plasma-free" will be used herein to describe the substrate processing region during application of no or essentially no plasma power to the substrate processing region. The etchants (the metal-and-halogen-containing precursor) described possess energetically favorable etch reaction pathways which enable the substrate processing region to be plasma-free during operations of etching metal-containing materials herein. Stated another way, the electron temperature in the substrate processing region may be less than 0.5 eV, less than 0.45 eV, less than 0.4 eV, or less than 0.35 eV according to one or more embodiments. Moreover, the metal-and-halogen-containing precursor may have not been excited in any remote plasma prior to entering the substrate processing region in embodiments. For example, if a remote plasma region or a separate chamber region is present and used to conduct the halogen-containing precursor toward the substrate processing region, the separate chamber region or remote plasma region may be plasma-free as defined herein.

The substrate processing region and any remote regions through which the metal-and-halogen-containing precursors pass may be "hydrogen-free" according to one or more embodiments. Hydrogen and —OH groups, in embodiments, may add material to metals and metal nitrides such that the etch process is hindered. The metal film or the metal nitride film may become thicker instead of thinner. The presence of hydrogen in the substrate processing region may reduce the effective etch selectivity.

In some embodiments, the metal-and-halogen-containing precursor (e.g. $WCl_6$) is supplied with a carrier gas at a flow rate of in the range of about 5 sccm and 500 sccm, in the range of about 10 sccm and 300 sccm, in the range of about 25 sccm and 200 sccm, in the range of about 50 sccm and 150 sccm or in the range of about 75 sccm and 125 sccm.

The reactions may proceed thermally, excited only by the temperature of the substrate itself, according to one or more embodiments. In embodiments which use the temperature of the substrate to effect the etching reaction, the term "plasma-free" may be used herein to describe the substrate processing region during application using no or essentially no plasma power. The plasma power may also be kept below small threshold amounts to enable the appropriate reactions to proceed. The plasma power applied to the substrate processing region may be less than 100 watts, less than 50 watts, less than 30 watts, less than 10 watts and may be 0 watts in various embodiments. The pressure within the substrate processing region may be in the range of about 0.1 Torr and 50 Torr, in the range of about 0.2 Torr and 30 Torr, in the range of about 0.5 Torr and 20 Torr, in the range of about 1 Torr and 10 Torr in embodiments.

Figure 1H:
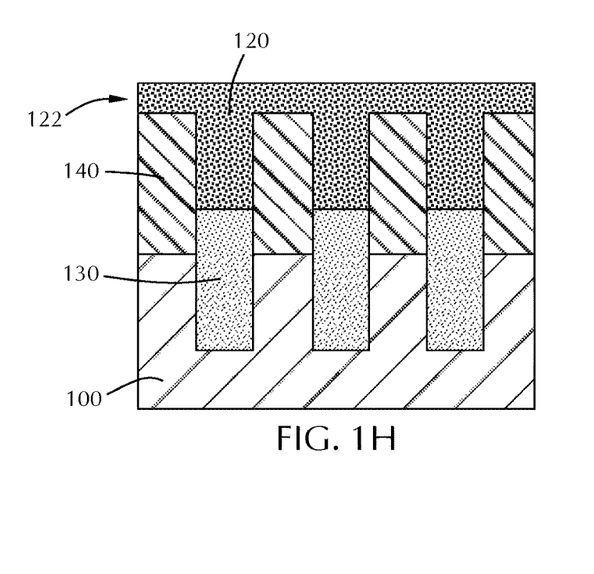

FIG. 1H shows the formation of a metal film 120 with an overburden 122, similar to that of FIG. 1B. The metal film 120 is formed in the gaps 150 and covers the top surface 144 of the second film 140 and the top surface 132 of the pillars 130. The metal film 120 can be the same metal film 120 deposited in FIG. 1B, or a different metal film. In some embodiments, the metal film 120 has the same metal throughout formation of the high aspect ratio features.

Figure 1I:
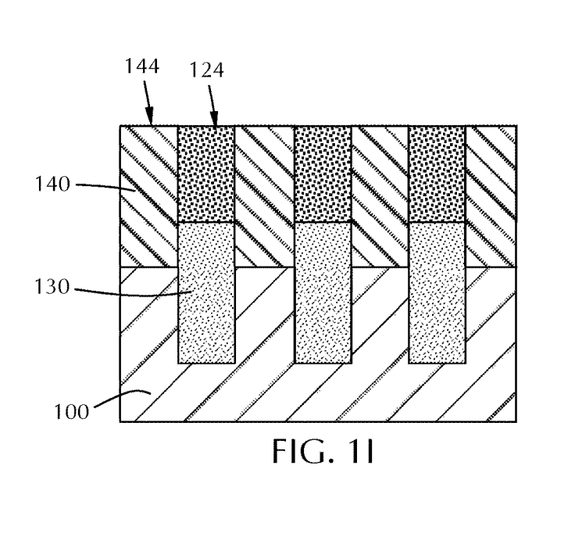

In FIG. 1I, the overburden 122 is removed so that the top surface 124 of the metal film 120 is substantially coplanar with the top surface 144 of the second film 140. This is similar to the process illustrated and described with respect to FIG. 1C. In some embodiments, there is no overburden 122 formed. The overburden can be removed by CMP or selective etching processes.

Figure 1J:
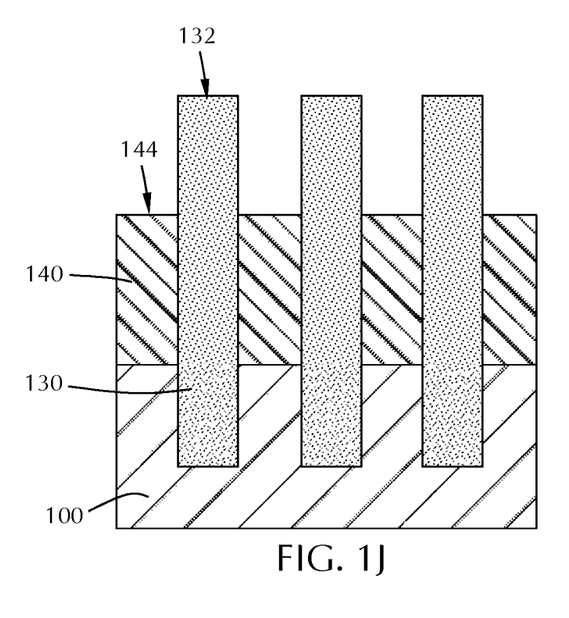

In FIG. 1J, the metal film 120 is oxidized to form the metal oxide pillars 130 so that the top surface 132 of the metal oxide pillars 130 extends above the top surface 144 of the second film 140. The metal oxide pillars 130 can be the same metal oxide as illustrated in FIG. 1D, or a different metal oxide. For example, the metal oxide can be alternated between oxides and nitrides, or can be mixed oxynitride films.

Figure 1K:
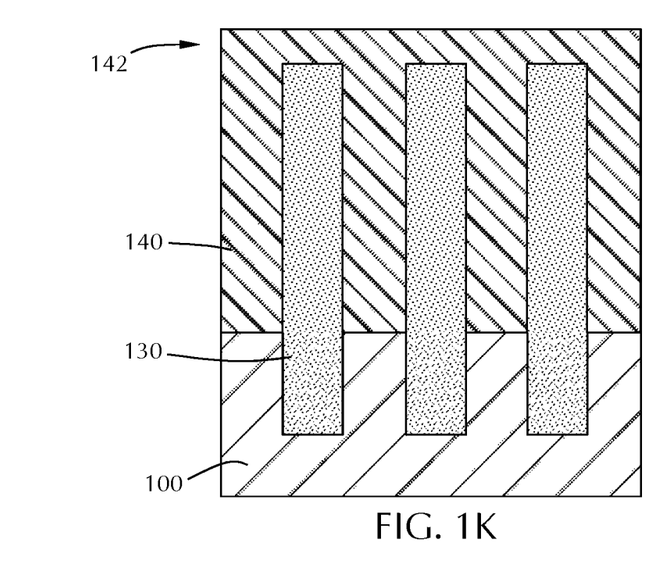
Figure 1L:
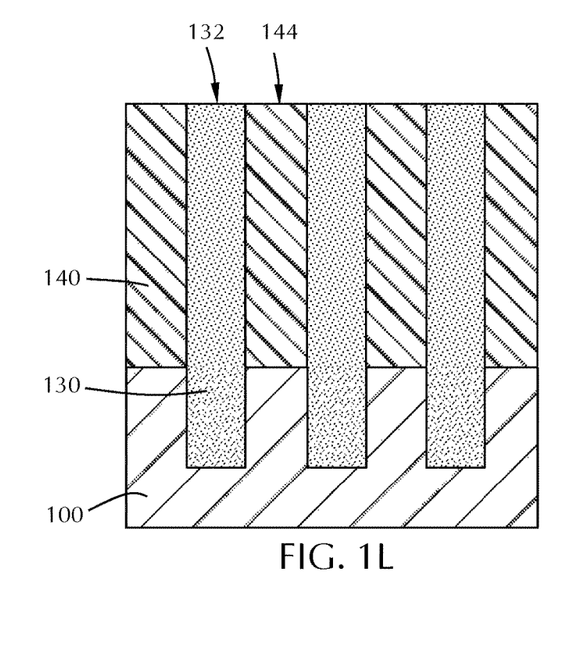

In FIG. 1K, a flowable second film 140 is formed in the gaps between the pillars 130 so that an overburden 142 is formed on the top surface 132 of the pillars 130. In some embodiments, there is no overburden 142 formed. This process is similar to that illustrated and described with respect to FIG. 1E. In FIG. 1L, the overburden 142 is removed by a CMP or selective removal process, similar to that shown and described with respect to FIG. 1F.

To continue growing the height of the self-aligned high aspect ratio structures, the pillar 130 can be recessed, like that shown in FIG. 1G, followed by repeating cycles of metal deposition (FIG. 1B), optional overburden removal (FIG. 1C), volumetric expansion (FIG. 1D), flowable film deposition (FIG. 1E) and optional overburden removal (FIG. 1F). If another cycle is to follow, recessing of the pillar 130 (FIG. 1G) can also occur before repeating the cycle.

Figure 1M:
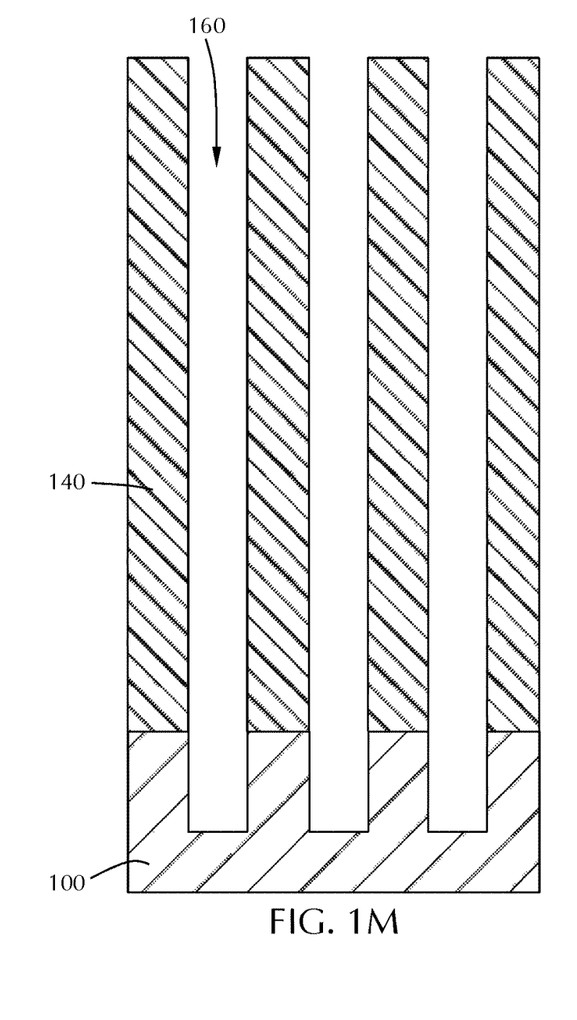

Once the height of the self-aligned structure has reached a predetermined height, the cycles are completed. The pillar 130 can then be removed by a selective etching process, like the process used to recess the pillars 130. In the removal of the pillars 130, as illustrated in FIG. 1M, the etching process continues until all of the pillars 130 have been removed from the gaps between the films 140 to form the high aspect ratio features 160.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
   (a) providing a substrate with a substrate surface having at least one feature extending into the substrate from the substrate surface, the feature having a bottom and sidewalls, the substrate comprising a first material, a metal oxide pillar is positioned within the feature and extends out of the feature to a top surface of the metal oxide pillar;
   (b) forming a second film on the substrate so that the top surface of the metal oxide pillar is exposed;
   (c) recessing the metal oxide pillar to form gaps in the second film;
   (d) depositing a metal film on the recessed metal oxide pillar so that the metal film fills the feature in the substrate and the gap through the second film;
   (e) volumetrically expanding the metal film to form a metal oxide pillar extending from a top of the second film;
   (f) repeating steps (b) through (e) a predetermined number of times;
   (g) repeating step (b); and
   (h) removing the metal oxide pillar to leave an empty feature in the substrate and passage through the second film.

2. The method of claim 1, wherein providing the substrate in (a) comprises providing a structured substrate with features having a metal film therein and volumetrically expanding the metal film to form the metal oxide pillar.

3. The method of claim 2, wherein volumetrically expanding the metal film forms a metal oxide pillar extending straight up from the substrate surface.

4. The method of claim 1, wherein forming a second film on the substrate so that the top surface of the metal oxide pillar is exposed in (b) comprises depositing the second film so that the second film covers the substrate surface and the top surface of the metal oxide pillar, and removing a portion of the second film to expose the top surface of the metal oxide pillar by a chemical-mechanical planarization process.

5. The method of claim 1, wherein recessing the metal oxide pillar in (c) comprises etching the metal oxide pillar.

6. The method of claim 5, wherein etching the metal oxide pillar comprises exposing the metal oxide pillar to a metal halide compound.

7. The method of claim 6, wherein the metal halide compound has a different metal than the metal oxide pillar.

8. A processing method comprising:
   providing a substrate with a substrate surface;
   forming at least one feature in the substrate, the at least one feature extending into the substrate from the substrate surface, the feature having a bottom and sidewalls;
   forming a metal oxide pillar in the feature comprising depositing a metal film in the feature and volumetrically expanding the metal film to extend out of the feature to a metal oxide pillar top, the metal oxide pillar extending orthogonally from the substrate surface;
   depositing a second film on the substrate surface so that the second film covers the substrate surface and the metal oxide pillar;
   removing the second film by chemical-mechanical planarization to expose the metal oxide pillar top through the second film;
   etching the metal oxide pillar by exposing the metal oxide pillar to a metal halide compound to leave an empty feature in the substrate and a passage through the second film.

* * * * *